(12) United States Patent
Ahamed et al.

(10) Patent No.: US 10,314,202 B2
(45) Date of Patent: Jun. 4, 2019

(54) HEAT SPREADING MODULE FOR PORTABLE ELECTRONIC DEVICE

(71) Applicant: FUJIKURA LTD., Tokyo (JP)

(72) Inventors: Mohammad Shahed Ahamed, Tokyo (JP); Yuji Saito, Tokyo (JP); Akihiro Takamiya, Tokyo (JP); Makoto Takahashi, Tokyo (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 0 days.

(21) Appl. No.: 15/236,781

(22) Filed: Aug. 15, 2016

(65) Prior Publication Data

US 2017/0055372 A1    Feb. 23, 2017

(30) Foreign Application Priority Data

Aug. 19, 2015  (JP) .................. 2015-162134

(51) Int. Cl.
*H05K 7/20*  (2006.01)
*F28D 15/04*  (2006.01)
(Continued)

(52) U.S. Cl.
CPC ..... *H05K 7/20336* (2013.01); *F28D 15/0233* (2013.01); *F28D 15/0275* (2013.01);
(Continued)

(58) Field of Classification Search
CPC ............ H05K 7/20336; H05K 7/20509; F28D 15/0275; F28D 15/04; F28D 15/0233; G06F 1/203; H01L 23/427
See application file for complete search history.

(56) References Cited

U.S. PATENT DOCUMENTS 5,451,989 A * 9/1995 Kadowaki .............. B41J 29/377
                                                    165/104.33
2003/0102108 A1   6/2003 Sarraf et al.
(Continued)

FOREIGN PATENT DOCUMENTS

CN      101022714 A      8/2007
CN      101573017 A      11/2009
(Continued)

OTHER PUBLICATIONS

Japanese Notice of Allowance of Application No. 2015-162134 dated May 24, 2016.
(Continued)

*Primary Examiner* — Jon T. Schermerhorn, Jr.
(74) *Attorney, Agent, or Firm* — Sughrue Mion, PLLC

(57) ABSTRACT

In a heat spreading module for a portable electronic device configured such that a heat pipe is attached along a metal plate with which a heating element is brought into close contact, and heat of a heated region of the metal plate with which the heating element is brought into close contact is transferred to a place on the metal plate apart from the heated region by the heat pipe, the heat pipe is configured such that a container is formed of a pipe, a portion of the container arranged on the heated region is a heated portion, and a portion of the container apart from the heated region is a heat dissipation portion that dissipates heat to the metal plate, and the heated portion is formed in a flat shape, and the heat dissipation portion is formed to be thicker than the heated portion having the flat shape.

5 Claims, 4 Drawing Sheets

(51) Int. Cl.
*H01L 23/427* (2006.01)
*G06F 1/20* (2006.01)
*H04M 1/02* (2006.01)
*F28D 15/02* (2006.01)
*F28F 13/00* (2006.01)

(52) U.S. Cl.
CPC .............. *F28D 15/04* (2013.01); *G06F 1/203* (2013.01); *H01L 23/427* (2013.01); *H04M 1/0202* (2013.01); *H05K 7/20509* (2013.01); *F28F 2013/006* (2013.01)

(56) References Cited

U.S. PATENT DOCUMENTS

| | | | |
|---|---|---|---|
| 2008/0210407 A1* | 9/2008 | Kim | F28D 15/0233 165/104.26 |
| 2009/0266513 A1* | 10/2009 | Xiong | H01L 23/427 165/80.3 |
| 2015/0192369 A1* | 7/2015 | Rivera | H05K 7/20663 165/104.19 |
| 2015/0219400 A1 | 8/2015 | Sasaki et al. | |
| 2016/0295679 A1* | 10/2016 | Yeini | H01L 23/427 |

FOREIGN PATENT DOCUMENTS

| | | |
|---|---|---|
| CN | 104039115 A | 9/2014 |
| JP | 5579349 B1 | 8/2014 |
| JP | 2014-165596 A | 9/2014 |
| JP | 2015-211056 A | 11/2015 |
| TW | M269703 U | 7/2005 |
| TW | M454705 U1 | 6/2013 |

OTHER PUBLICATIONS

Communication dated Dec. 9, 2016 from the European Patent Office in counterpart application No. 16184449.3.
Communication dated Apr. 13, 2017 from the Taiwanese Intellectual Property Office counterpart application No. 105124643.
Communication dated Aug. 23, 2017, issued by the State Intellectual Property Office of People's Republic of China in counterpart application No. 201610670221.9.
Communication dated Dec. 4, 2017, from European Patent Office in counterpart application No. 16 184 449.3.
Communication dated Aug. 1, 2018 from the State Intellectual Property Office of the P.R.C. in counterpart Application No. 201610670221.9.

* cited by examiner

HEAT SPREADING MODULE FOR PORTABLE ELECTRONIC DEVICE

CROSS REFERENCE TO RELATED APPLICATIONS

Priority is claimed on Japanese Patent Application No. 2015-162134, filed Aug. 19, 2015, the content of which is incorporated herein by reference.

BACKGROUND OF THE INVENTION

Field of the Invention

The present invention relates to a heat spreading module that is used for a portable electronic device such as a multifunctional mobile phone (smartphone) and a tablet personal computer.

Description of Related Art

A portable information terminal configured to transfer heat of a heating element to a low temperature portion by a heat pipe is described in Japanese Unexamined Patent Application, First Publication No. 2014-165596 A. The heat pipe is configured such that a copper tube is sealed at both ends thereof and a working fluid is contained inside the copper tube. A central portion of the heat pipe is arranged on an upper surface of the heating element, that is, a CPU, and both end sides extend to a battery side along a side portion of a casing. In the configuration described in Japanese Unexamined Patent Application, First Publication No. 2014-165596 A, the central portion of the heat pipe arranged on the CPU is a flattened portion processed flatly due to a restriction on the space such as a reduction in the thickness of the casing.

In an electronic device such as the portable information terminal described in Japanese Unexamined Patent Application, First Publication No. 2014-165596 A, the CPU mounted on a substrate (motherboard) has a greater height than other elements. When the flattened portion of the heat pipe is arranged on the CPU as described in Japanese Unexamined Patent Application, First Publication No. 2014-165596 A, therefore, the information terminal can be thinned. In the configuration described in Japanese Unexamined Patent Application, First Publication No. 2014-165596 A, however, almost all of the heat of the CPU is transferred to the heat pipe, and the heat pipe transfers that heat. The heat pipe thus requires a large heat transfer capacity, and there is no other choice but to use the heat pipe having a large size or a large diameter. Accordingly, the information terminal is increased in size or thickness.

In addition to the large amount of heat input from the CPU to the heat pipe, since a heat input portion (or heated portion) that receives heat from the CPU is the flattened portion, the amount of working fluid retained in the heat input portion is small. When the amount of heat generation in the CPU is large, therefore, dry-out of the heat pipe is likely to occur, whereby capability to cool down the CPU might be limited.

SUMMARY OF INVENTION

The present invention has been made in view of the circumstances described above, and provides a heat spreading module capable of achieving both the reduction in the thickness of a portable electronic device and the increase in the cooling capability.

A first aspect of the present invention is a heat spreading module for a portable electronic device configured such that a heat pipe is attached along a metal plate with which a heating element is brought into close contact, and heat of a heated region of the metal plate with which the heating element is brought into close contact is transferred to a place on the metal plate apart from the heated region by the heat pipe, wherein the heat pipe is configured such that a container is formed of a pipe made of metal, a portion of the container arranged on the heated region serves as a heated part, and a portion of the container apart from the heated region serves as a heat dissipation portion that dissipates heat to the metal plate, the heated portion is formed in a flat shape in such a manner that the container is squashed, and the heat dissipation portion is formed to be thicker than the heated portion having the flat shape, the metal plate has a hole portion having a predetermined length formed in a portion corresponding to the heated region, the heated portion having the flat shape is arranged inside the hole portion, and the heat dissipation portion is brought into close contact with a surface of the place on the metal plate apart from the heated region, and in the heated region, heat is transferred from the heating element to the metal plate and the heated portion.

In a second aspect of the present invention according to the heat spreading module for a portable electronic device of the above-mentioned first aspect, a heat transfer material may be provided on the heated region so as to come into contact with a surface of the heated portion formed in the flat shape and so as to close the hole portion, and the heating element comes into contact with the heat transfer material so as to be capable of transferring heat.

According to the above-mentioned aspects of the present invention, heat of the heating element is transferred to the heated portion of the heat pipe and the metal plate in the heated region. The heated portion of the heat pipe is formed in the flat shape and arranged inside the hole portion formed in the metal plate. The metal plate is not interposed between the heating element and the heated portion of the heat pipe. Therefore, the heat spreading module or a portable electronic device using the heat dissipation plate can be thinned. According to the above-mentioned aspects of the present invention, heat of the heating element is transferred not only to the heated portion of the heat pipe but also to the metal plate. Therefore, the amount of heat input to the heated portion of the heat pipe is moderated, whereby dry-out hardly occurs even though the heated portion is formed in the flat shape, and the heat dissipation performance or the cooling performance for the heating element is not deteriorated.

According to the above-mentioned aspects of the present invention, the heat dissipation portion of the heat pipe is thicker than the heated portion, whereby vapor of a working fluid flows smoothly. Furthermore, the heat dissipation portion is brought into close contact with the metal plate. Therefore, the heat pipe has the excellent heat transfer performance, and moreover, the excellent heat dissipation performance.

DETAILED DESCRIPTION OF THE INVENTION

Figure 1:
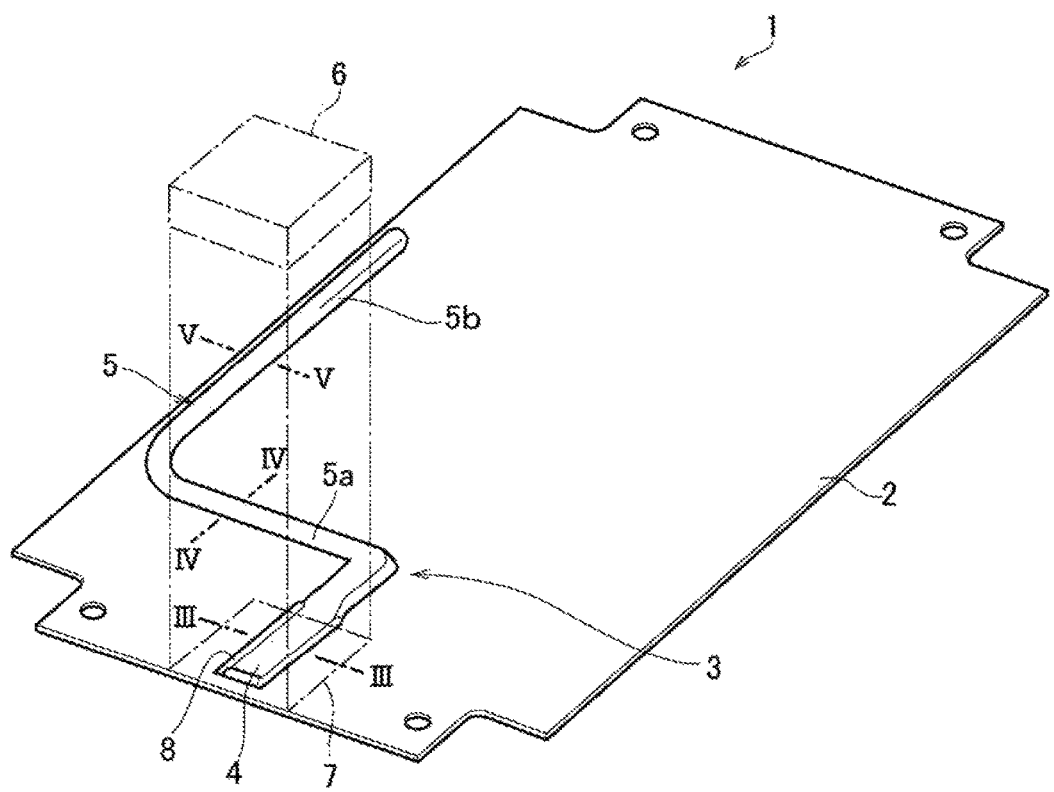
FIG. 1 is a perspective view schematically illustrating an example of the present invention.

A heat dissipation plate (heat spreading module) 1 according to an embodiment of the present invention is incorporated in a portable electronic device such as a smartphone and a tablet personal computer (PC). The heat dissipation plate 1 dissipates heat of a heating element such as a CPU and reduces or suppresses a peak temperature of the heating element. An example of the heat dissipation plate 1 is illustrated in FIG. 1. The heat dissipation plate 1 mainly includes a metal plate 2 in order to enlarge a dissipation region. A heat pipe 3 is attached to the metal plate 2.

Since the metal plate 2 is expected to have a high thermal conductivity and to be thin, a thin copper plate having a thickness of about 0.2 mm is employed as the metal plate 2. The heat pipe 3 is a known heat transferring element that transfers heat by a working fluid contained inside a container. For example, the heat pipe 3 is configured such that a copper pipe is used as the container, water as the working fluid is contained inside the container, and an ultrafine wire such as a thin copper wire and a metal sintered compact having a porous structure or the like are accommodated as a wick inside the container. In the example illustrated in FIG. 1, the heat pipe 3 is formed in a flat shape.

Figure 2:
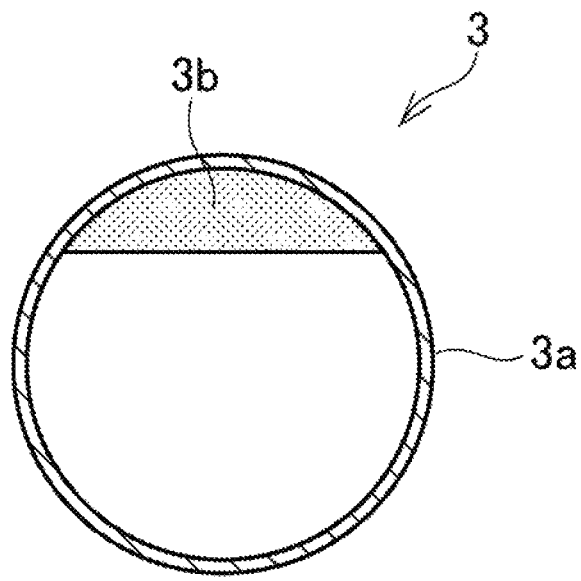
FIG. 2 is a cross-sectional view for describing a structure of a heat pipe.
Figure 2:
Figure 2:
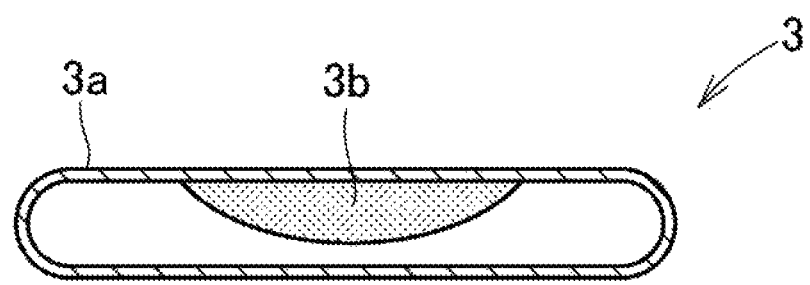

The heat pipe 3 can be manufactured, for example, as illustrated in FIG. 2. A copper pipe having a circular cross section is prepared as a container 3a, and a wick 3b is arranged inside the container 3a and fixed by sintering or the like. A working fluid is then injected into the container 3a, air is expelled, and the container 3a is closed tightly in this state. After that, the container 3a is processed to be bent into a predetermined shape, and a load is applied in a radial direction to squash the container 3a, whereby the container 3a is molded into a flat shape.

A portion having a predetermined length on one end side of the heat pipe 3 is a heated portion 4 where the working fluid evaporates due to heat input from the outside. A portion on the other end side is a heat dissipation portion 5 that dissipates heat to the outside. The heated portion 4 is squashed so as to be thinner than the heat dissipation portion 5. For example, the heated portion 4 has a thickness of about 0.4 mm. The heat dissipation portion 5 is molded into a flat shape having a thickness of about 0.85 mm. Therefore, internal volume per unit length is small in the heated portion 4 and large in the heat dissipation portion 5.

The metal plate 2 has a shape conforming to a shape of an electronic device to be used. In the example illustrated in FIG. 1, the metal plate 2 has a substantially rectangular shape. A substantially central portion on one end side in a longitudinal direction of the metal plate 2 is a heated region 7 that receives heat from a heating element 6 such as a CPU. A hole portion 8 is formed in the heated region 7. The hole portion 8 is a so-called elongated hole having a width wider than that of the aforementioned heated portion 4 and narrower than that of the heated region 7. The heated portion 4 is fit into the hole portion 8.

Figure 3:
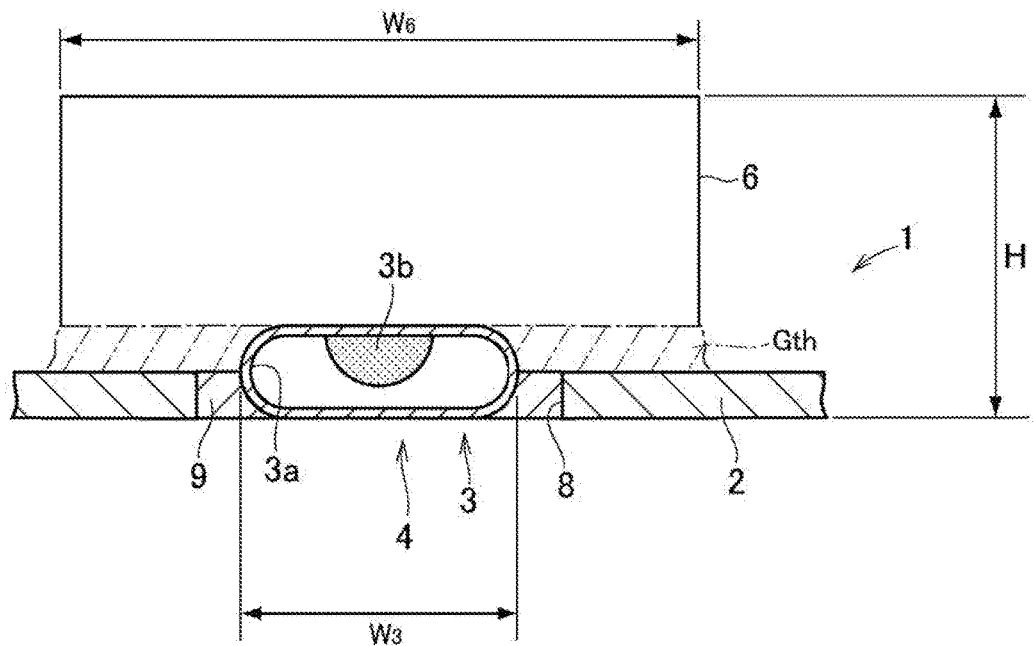
FIG. 3 is a cross-sectional view taken along line III-III of FIG. 1.

The heated portion 4 fit into the hole portion 8 is illustrated in FIG. 3 using a cross-sectional view. The heated portion 4 is fit into the hole portion 8 while a lower surface in FIG. 3 substantially coincides with a lower surface of the metal plate 2. A gap between an inner surface (or inner edge) of the hole portion 8 and the heated portion 4 is filled with an appropriate fixing material (for example, solder) 9, whereby the heated portion 4 is fixed to the metal plate 2. The thickness of the heated portion 4 is thicker than that of the metal plate 2 even though the heated portion 4 is formed in a flat shape as described above. An upper portion of the heated portion 4 in FIG. 3, therefore, projects upward from an upper surface of the metal plate 2. However, since the heated portion 4 is fit into the hole portion 8 of the metal plate 2, the metal plate 2 is not interposed between the heated portion 4 (heat pipe 3) and the heating element 6. Accordingly, a height H at a place where the heating element 6 is provided (for example, dimension from the lower surface of the heated portion 4 (lower surface of the metal plate 2) to an upper surface of the heating element 6) is reduced by the thickness of the metal plate 2. In other words, the heat dissipation plate 1 itself is thinned. By using such heat dissipation plate 1, the portable electronic device can be reduced in thickness. Although a lower surface of the heating element 6 is in contact with an upper surface of the heated portion 4, the lower surface of the heating element 6 is apart from the upper surface of the metal plate 2. Therefore, a space between the lower surface of the heating element 6 and the upper surface of the metal plate 2 is filled with a thermal conductive material such as thermal grease Gth.

The heat pipe 3 is bent in a crank shape at a place where the heat pipe 3 is pulled out of the above-mentioned hole portion 8, whereby the heat pipe 3 extends along a surface (upper surface in FIGS. 1 and 3) of the metal plate 2. At a place where the heat pipe 3 is pulled out of the hole portion 8 to extend along the surface of the metal plate 2, the heat pipe 3 is bent at a substantially right angle toward one side portion of the metal plate 2. At a place close to the side portion of the metal plate 2, the heat pipe 3 is further bent at a substantially right angle along the side portion of the metal plate 2. The purpose of bending the heat pipe 3 in such a manner is to avoid interference with components incorporated in the electronic device. Therefore, a bent shape of the heat pipe 3 may be a shape conforming to an inner structure of the electronic device.

Figure 4:
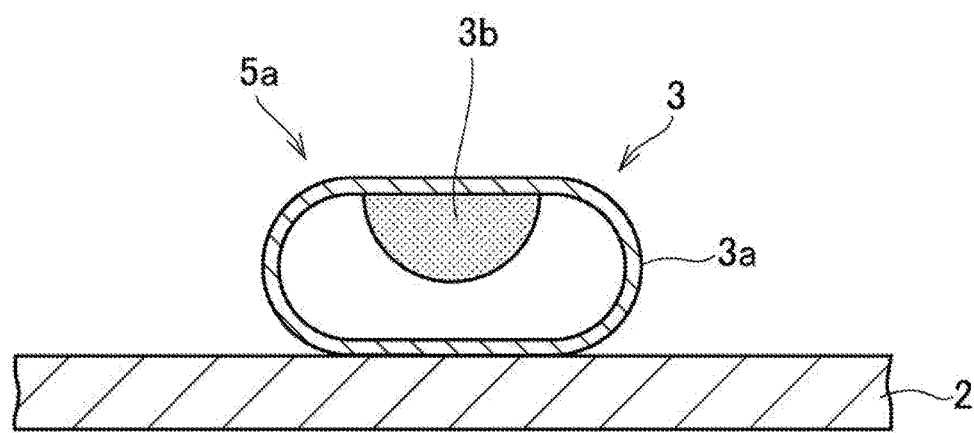
FIG. 4 is a cross-sectional view taken along line IV-IV of FIG. 1.
Figure 5:
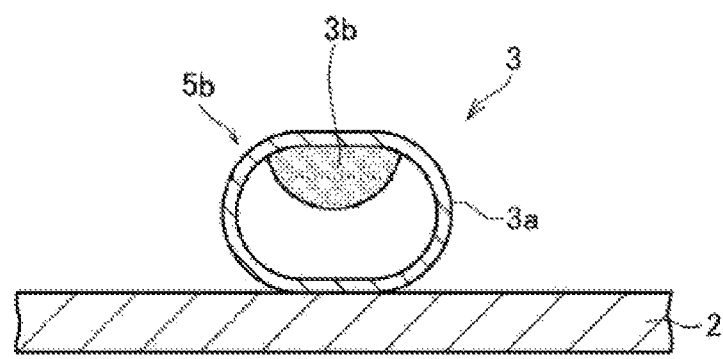
FIG. 5 is a cross-sectional view taken along line V-V of FIG. 1.

A portion of the heat pipe 3 directed to the side portion of the metal plate 2 and bent so as to extend along the side portion while the heat pipe 3 extends along the surface of the metal plate 2 in the above-mentioned manner is the heat dissipation portion 5. A cross-sectional shape of a portion 5a of the heat dissipation portion 5 extending from the above-mentioned heated portion 4 toward the side portion of the metal plate 2 is illustrated in FIG. 4. A cross-sectional shape of a portion 5b of the heat dissipation portion 5 extending along the side portion of the metal plate 2 is illustrated in FIG. 5.

The portion 5a extending toward the side portion of the metal plate 2 is formed in a flat shape, but somewhat thicker than the heated portion 4. The portion 5b extending along the side portion of the metal plate 2 is formed in a flat shape, but much thicker than the heated portion 4. The purpose of forming the heat dissipation portion 5 so that the heat dissipation portion 5 is thicker than the heated portion 4 as described above is to increase the internal volume of the heat dissipation portion 5 in preparation for evaporation and an increase in volume of the working fluid. The heat dissipation portion 5 is brought into close contact with the metal plate 2 and fixed to the metal plate 2 by an appropriate manner such as using solder.

The above-mentioned heat dissipation plate 1 is accommodated inside the portable electronic device such as a smartphone, whereby the heating element 6 such as a CPU is brought into contact with the heated region 7 so as to be capable of transferring heat. In this case, since a width $W_6$ of the heating element 6 is greater than a width $W_3$ of the heated portion 4 of the heat pipe 3, the heating element 6 comes into contact so as to be capable of transferring heat to both the heated portion 4 of the heat pipe 3 and the metal plate 2. A place on the metal plate 2 apart from the heated region 7 is brought into contact with or arranged on a portion having a low temperature such as a battery (not illustrated).

Heat generated by the operation of the heating element 6 is transferred to the heat pipe 3 and the metal plate 2 in the heated region 7. In the heat pipe 3, the working fluid evaporates at the heated portion 4, and the vapor flows into the heat dissipation portion 5 having a low temperature and a low pressure. The working fluid then dissipates heat and condenses in the heat dissipation portion 5. Therefore, the heat transferred to the heat pipe 3 is transferred to the heat dissipation portion 5 in the form of latent heat of the working fluid, and the heat is dissipated from the heat dissipation portion 5 to the metal plate 2. The condensed working fluid flows back to the heated portion 4 by capillary force that occurs in the wick 3b and is heated again to evaporate, whereby the heat transfer is performed.

The heat transferred from the heating element 6 to the metal plate 2 is conducted to a place on the metal plate 2 having a low temperature. In such a manner, in the above-mentioned heat dissipation plate 1, heat of the heating element 6 is diffused to a place apart from the heating element 6 by the heat pipe 3 and the metal plate 2, and dissipated from the portion apart from the heating element 6 to the outside. As a result, the heating element 6 is cooled down and operation failure is prevented.

In the above-mentioned heat dissipation plate 1 according to an embodiment of the present invention, heat of the heating element 6 is transferred to the heat pipe 3 and the metal plate 2 in the heated region 7, and dissipated by the heat pipe 3 and the metal plate 2, whereby the amount of heat input to the heat pipe 3 is suppressed. Therefore, even though the heated portion 4 of the heat pipe 3 is formed in a thin flat shape and the amount of working fluid retained in the heated portion 4 is limited, the occurrence of so-called dry-out, that is, a lack of the working fluid in the heated portion 4 that leads to a limitation on the heat transfer, can be avoided or suppressed. Since the heat dissipation portion 5 is formed to be thicker than the heated portion 4 and has the internal volume larger than that of the heated portion 4, the working fluid that has evaporated and increased its volume smoothly flows from the heated portion 4 into the heat dissipation portion 5, whereby the heat transfer by the heat pipe 3 can be sufficiently performed. According to the heat dissipation plate 1 of an embodiment of the present invention, it is possible to achieve both the increase in the capability of the heat pipe 3 and the metal plate 2 to cool down the heating element 6 and the reduction in the thickness of the portable electronic device.

Figure 6:
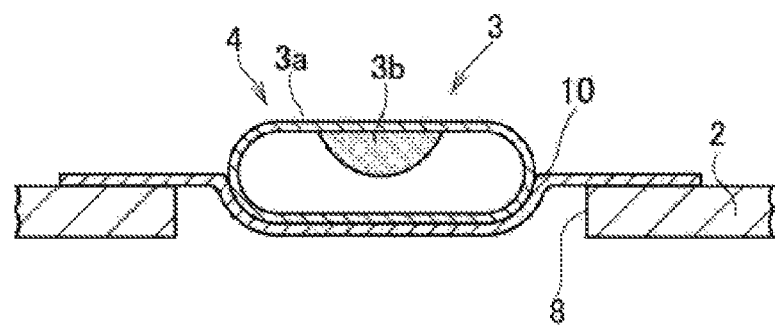
FIG. 6 is a view for describing an example of a heat transfer material provided, which is a cross-sectional view drawn in the same way as FIG. 3.

FIG. 6 is a cross-sectional view illustrating another embodiment of the present invention, where the hole portion 8 in which the heated portion 4 is arranged is closed by a heat transfer material 10. The heat transfer material 10 is a plate material or a sheet material made of metal such as copper. The heat transfer material 10 is thinner than the metal plate 2. A central portion in a width direction of the heat transfer material 10 comes into close contact with a surface of the heated portion 4 (lower surface in FIG. 6). Both ends are pulled out of both sides of the heated portion 4 through the hole portion 8 to an upper surface side of the metal plate 2 in FIG. 6 and joined to the upper surface of the metal plate 2. The heat transfer material 10 is formed to have such a size that its contour is the same as a contour of the lower surface of the heating element 6, or such a size that its contour exceeds the contour of the lower surface of the heating element 6. In the configuration illustrated in FIG. 6, the heating element 6 is arranged on the upper surface side in FIG. 6 and comes into direct contact with the heated portion 4 of the heat pipe 3 held by the heat transfer material 10. A space between the lower surface of the heating element 6 and an upper surface of the heat transfer material 10 is filled with a thermal conductive material such as thermal grease (omitted in FIG. 6). Heat of the heating element 6 is directly transferred to the heat pipe 3, transferred to the heat transfer material 10 through the thermal conductive material, and transferred to the metal plate 2 through the heat transfer material 10. As illustrated in FIG. 6, since the heat transfer material 10 is also in contact with the lower surface of the heated portion 4 in the heat pipe 3, heat from the heat transfer material 10 is also transferred to the heat pipe 3. The heating element 6 can also be arranged on a lower surface side of the metal plate 2. In this case, heat of the heating element 6 is transferred to the heat pipe 3 through the heat transfer material 10, and heat is directly transferred from the heating element 6 to the metal plate 2. In any of these cases, a portion of the heat transferred from the heating element 6 to the metal plate 2 is transferred to the heat pipe 3 through the heat transfer material 10. Therefore, a lack of the heat dissipation by the metal plate 2 can be supplemented by the heat transfer by the heat pipe 3. Therefore, heat of the heating element 6 is efficiently dissipated by the heat transfer by the heat pipe 3 and the heat transmission by the metal plate 2, and an increase in the temperature around the heated region 7 is suppressed, whereby the heating element 6 can be effectively cooled down.

Examples and a comparative example of the present embodiment performed for confirmation of the effects of the present invention will be described.

Example 1

A copper plate having a thickness of 0.2 mm was used as the metal plate. A heat pipe configured in such a manner that the wick made of a thin copper wire was arranged inside a copper pipe and water was contained as the working fluid was used as the heat pipe. The heated portion was processed flatly so as to have a thickness of 0.4 mm. The heat dissipation portion was processed into a flat shape having a thickness of 0.6 mm. The heated portion of the heat pipe was arranged inside the hole portion formed in the metal plate. The heated region, therefore, has a maximum thickness of 0.4 mm in the heated portion. As a substitute for the heating element, a heater, the output of which is adjustable, was brought into contact with the heated region. The temperature of the heated portion was measured when the output of the heater was set to 3 W, 4 W, and 5 W. The result of the measurement of the temperature is illustrated in Table 1.

Example 2

The metal plate and the heat pipe similar to those of Example 1 described above were used. The aforementioned heat transfer material illustrated in FIG. 6 was provided on the heated region, and the thickness of the heat transfer material was 0.05 mm. Accordingly, the thickness of the heated portion was set to 0.35 mm, whereby the heated region had a maximum thickness of 0.4 mm as was the case in Example 1. In the same way as Example 1 described above, as a substitute for the heating element, a heater, the output of which is adjustable, was brought into contact with the heated region. The temperature of the heated portion was measured when the output of the heater was set to 3 W, 4 W, and 5 W. The result of the measurement of the temperature is illustrated in Table 1.

Comparative Example

The metal plate and the heat pipe similar to those of Example 1 and Example 2 described above were used. The aforementioned hole portion was not provided in the heated region, and the heated portion of the heat pipe was directly brought into close contact with the metal plate. The heated portion was processed into a thin flat shape having a thickness of 0.2 mm so that the heated region had a maximum thickness of 0.4 mm. Other conditions were the same as those of Example 1 and Example 2 described above. As a substitute for the heating element, a heater, the output of which is adjustable, was brought into contact with the heated region. The temperature of the heated portion was measured when the output of the heater was set to 3 W, 4 W, and 5 W. The result of the measurement of the temperature is illustrated in Table 1.

TABLE 1

| Amount of Heat (W) | Example 1 (° C.) | Example 2 (° C.) | Comparative Example (° C.) |
|---|---|---|---|
| 3 | 69.4 | 72.2 | 80.4 |
| 4 | 80.5 | 83.5 | 92.0 |
| 5 | 93.5 | 96.8 | 110.3 |

In any of Example 1, Example 2, and Comparative Example, the heated region has a maximum thickness of 0.4 mm and thus is reduced in thickness. However, as apparent from the result of the measurement illustrated in Table 1, in Comparative Example, the temperature of the heated portion is higher than those in Example 1 and Example 2, thermal resistance of the entire heat dissipation plate is large, and the cooling effect for the heating element is inferior. On the other hand, Example 1 and Example 2 revealed that thermal resistance of the heat dissipation plate is small enough for practical use, the heat transfer or the heat dissipation from the heated portion side to the heat dissipation portion side is enhanced, and the heating element can be effectively cooled down, whereby both the reduction in the thickness and the cooling performance can be achieved.

Preferable embodiments of the present invention have been described above. It should be understood that these embodiments are only examples of the present invention, and should not be considered as limitations on the present invention. Addition, omission, replacement, and other changes can be performed without deviating from the scope of the present invention. The present invention, therefore, should not be regarded to be limited by the aforementioned explanation, but limited by the scope of the claims.

The invention claimed is:

1. A heat spreading module for a portable electronic device configured such that a heat pipe is attached along a metal plate, a heating element is attached to the heat pipe, and heat of a heated region of the metal plate is transferred to a place on the metal plate apart from the heated region by the heat pipe, wherein the heat pipe is configured such that a container is formed of a pipe made of metal, a portion of the container arranged on the heated region is a heated portion, a portion of the container apart from the heated region is a heat dissipation portion that is arranged on the metal plate and dissipates heat to the metal plate, a wick is arranged inside the container and is fixed to an upper inner surface of the container, and a vapor-path space portion is formed between the wick and a lower inner surface of the container, the heated portion is formed in a flat shape in such a manner that the container is squashed, and the heat dissipation portion is formed to be thicker than the heated portion having the flat shape, the metal plate has a hole portion having a predetermined length formed in a portion corresponding to the heated region, the heated portion having the flat shape is arranged inside the hole portion, in the heated region, the heating element is arranged on an upper surface of the heated portion of the heat pipe and is apart from the metal plate, and heat is transferred from the heating element to the metal plate and the upper surface of the heated portion of the heat pipe, a first part of the heat dissipation portion is extended from a cavity of the hole portion and onto an outer surface of the metal plate facing the heating element, the first part of the heat dissipation portion is longitudinally extended along the outer surface to a side of the metal plate, and a second part of the heat dissipation portion is longitudinally extended, from a longitudinal end of the first part of the heat dissipation portion furthest away from the heated portion, along the outer surface and the side of the metal plate, wherein the metal plate and the heating element are not in direct physical contact, wherein the heated portion is in direct physical contact with the heating element and interposes the metal plate and the heating element, wherein in a direction from the metal plate to the heating element, the heated portion comprises a greater thickness in the direction than the metal plate, wherein the heated portion is arranged within the cavity of the hole portion of the metal plate and is extended out of the cavity in the direction from the metal plate to the heating element, and wherein a portion of the heated portion is extended further in the direction towards the heating element than the metal plate such that the portion of the heated element is closer to the heating element than the metal plate is to the heating element.

2. The heat spreading module for the portable electronic device according to claim 1, wherein a heat transfer material is provided on the heated region so as to come into contact with a lower surface of the heated portion formed in the flat shape and so as to close the hole portion, and the heating element comes into contact with the heat transfer material so as to be capable of transferring heat.

3. The heat spreading module for the portable electronic device according to claim 1, wherein, in a cross section of the heat pipe, the wick is arranged within the heat pipe at the upper inner surface of the container.

4. The heat spreading module for the portable electronic device according to claim 3, wherein the upper inner surface of the container is a closest portion of an inner surface of the container to the heating element, in a direction from the metal plate to the heating element, and wherein the lower inner surface of the container is opposite to the upper inner surface of the container.

5. The heat spreading module according to claim 1, wherein the first part of the heat dissipation portion extends further froth the metal plate in the direction than the heated portion, wherein the second part of the heat dissipation portion extends further from the metal plate in the direction than the first part of the heat dissipation portion, and both of the first part and the second part of the heat dissipation portion extend, in the direction towards the heating element, from a flat surface of the metal plate flatly extending orthogonal to the direction at least along the first part and the second part of the heat dissipation portion.

\* \* \* \* \*